(12) United States Patent
Lee (10) Patent No.: US 11,088,899 B2
(45) Date of Patent: Aug. 10, 2021

(54) ON-SITE AUDIO CENTER SYSTEM BASED ON AUDIO OVER IP

(71) Applicant: Jae Ho Lee, Seoul (KR)

(72) Inventor: Jae Ho Lee, Seoul (KR)

( * ) Notice: Subject to any disclaimer, the term of this patent is extended or adjusted under 35 U.S.C. 154(b) by 581 days.

(21) Appl. No.: 16/060,960

(22) PCT Filed: Nov. 16, 2017

(86) PCT No.: PCT/KR2017/013013
§ 371 (c)(1),
(2) Date: Jun. 11, 2018

(87) PCT Pub. No.: WO2018/236005
PCT Pub. Date: Dec. 27, 2018

(65) Prior Publication Data
US 2020/0344118 A1 Oct. 29, 2020

(30) Foreign Application Priority Data
Jun. 19, 2017 (KR) .......................... 10-2017-0077395

(51) Int. Cl.
*H04L 12/24* (2006.01)
*G06F 3/16* (2006.01)
*G10K 15/02* (2006.01)

(52) U.S. Cl.
CPC .......... *H04L 41/0803* (2013.01); *G06F 3/162* (2013.01); *G10K 15/02* (2013.01)

(58) Field of Classification Search
None
See application file for complete search history.

(56) References Cited

U.S. PATENT DOCUMENTS

| 7,085,364 | B1* | 8/2006 | Ahmed | H04M 3/16 |
| | | | | 370/267 |
| 9,373,320 | B1* | 6/2016 | Lyon | G10L 21/0308 |
| 2007/0217400 | A1 | 9/2007 | Staples | |
| 2011/0096943 | A1* | 4/2011 | Ayres | H04H 60/04 |
| | | | | 381/107 |
| 2014/0181338 | A1* | 6/2014 | Loh | G06F 3/165 |
| | | | | 710/63 |
| 2017/0346581 | A1* | 11/2017 | Leopardi | H03G 9/12 |
| 2018/0035222 | A1* | 2/2018 | Anderson | G10L 19/008 |
| 2018/0139535 | A1* | 5/2018 | Cengarle | H04R 5/027 |

FOREIGN PATENT DOCUMENTS

| KR | 10-0788875 B1 | 12/2007 |
| KR | 10-0979804 B1 | 9/2010 |
| KR | 10-1057670 B1 | 8/2011 |
| KR | 10-2012-0123191 A1 | 11/2012 |

OTHER PUBLICATIONS

International Search Report of PCT/KR2017/013013, dated Mar. 16, 2018.
Ditzel III, et al., "Time Sensitive Network (TSN) Protocols and use in EtherNet/IP Systems", 2015 ODVA Industry Conference & 17th Annual Meeting, Oct. 13-15, 2015, Frisco, Texas.

* cited by examiner

*Primary Examiner* — Kenny S Lin (57) ABSTRACT

The present invention relates to an on-site audio center system based on an Audio over Internet protocol (AoIP), capable of efficiently transmitting audio by connecting a plurality of audio input devices to a plurality of audio output devices in a one-to-one manner through audio transmitting modules and audio receiving modules, so that an AoIP network is easily configured through a control personal computer (PC).

7 Claims, 5 Drawing Sheets

|       | Rx #1 | Rx #2 | Rx #3 |
|-------|-------|-------|-------|
| Tx #1 | O     | O     | O     |
| Tx #2 | X     | O     | X     |
| Rx #3 | X     | O     | O     |

ON-SITE AUDIO CENTER SYSTEM BASED ON AUDIO OVER IP

CROSS-REFERENCE TO RELATED APPLICATIONS

This application is a National Stage Entry of International Application No. PCT/KR2017/013013, filed on Nov. 16, 2017, which claims the benefit of and priority to Korean Patent Application No. 10-2017-0077395 filed on Jun. 19, 2017, the contents of which are incorporated herein by reference in their entirety.

TECHNICAL FIELD

The present invention relates to an audio control technology, and more particularly, to an on-site audio center system based on an Audio over Internet protocol (AoIP).

BACKGROUND ART

Industrial audio systems include public address (PA) systems (public broadcasting) for making announcements in the event of fire or emergency and sound reinforcement (SR) systems for making a performance or a speech.

The audio system is not installed in one place, but is installed variously depending on the intended use or environment. Depending on the intended purpose or use, there may be a case that a remote transmission is required, which causes sound quality degradation and manpower loss due to a line loss.

Recently, the rapid development of Ethernet and Internet protocol (IP) technologies has made many changes to the audio industry. In addition, an audio transmission based on an Audio over IP (AoIP) has remarkably improved various limitations of audio systems (sound quality degradation due to remote transmission, complicated wiring, and the like).

As audio transmission methods based on a local area network (LAN) cable, various transmission technologies, such as LiveWire, Dante, Q-LAN, RAVENNA, and CobraNET, have emerged in the market. In particular, the configuration of AoIP-based audio systems enables the construction cost of the audio systems to be significantly reduced.

International Organization for Standardization has partitioned a variety of network standard models into Layer 1 to Layer 7. Layer 1 is a physical layer, Layer 2 is a data link layer, Layer 3 is an IP network layer, and Layer 4 and above are layers unrelated to audio transmission.

Among the network-based audio transmission technologies, CobraNET transmits and receives signals in Layer 2, and AoIP transmits audio in Layer 3. At an early stage of network-based audio transmission technology, studies on Audio over Ethernet (AoE) were conducted in relation to audio industry related companies, but recently the companies are using various AoIP technologies to adapt to protocols of their own products.

CobraNet is a technology allowing real time transmission of audio signals in the data link layer. CobraNet was developed in 1996 by Cirrus Logic, Inc. in the U.S., and systems employing CobraNet are currently in use.

In particular, for an audio signal transmission, 64 channels at a frequency of 48 kHz with units of 20 bits are able to be simultaneously transmitted. In addition, CobraNet is used as an alternative for resolving audio signal degradation caused by electromagnetic interference, high-frequency attenuation, or remote transmission.

CobraNet is installed for audio transmission in large commercial facilities, such as large stadiums, airports, theme parks, international convention centers, and concert halls, but there are limitations that the technological fees paid for use of technologies for an analog-to-digital convertor (ADC) and a digital-to-analog convertor (DAC) or the purchase of interface apparatuses are costly.

AoIP is a technology of transmitting CD-quality audio having a frequency of 44.1 kHz through an IP network. AoIP is different from Voice over Internet protocol (VoIP). VoIP is used for signal transmission of the telephony quality, whereas AoIP is implemented using an existing network. AoIP has a latency within 0.01 seconds. Various uncompressed real-time audio transmission technologies based on the AoIP are emerging in the market.

Delivery of Advanced Network Technology to Europe (Dante) transmits audio signals via an IP-based network. Dante, developed by Audinate Pty Ltd. in Australia, has superiority in transmission speed, number of transmission channels, ease of manipulation, flexibility, and scalability, and thus is widely used in the audio industry.

In addition, audio signals may be transmitted and received to/from another Dante equipment in a local network using Internet standard protocols (e.g., transmission control protocol/IP (TCP/IP), user datagram protocol/IP (UDP/IP), and the like). Dante may transmits and receive data of gigabits by units of 24 bits having a frequency of 48 kHz in 512×512 channels, or units of 24 bits having a frequency of 96 kHz data in 256×256 channels.

Dante transmits and receives audio signals through an IP network of Layer 3 of the OSI third layer. In addition, a number of audio companies are using Dante protocols to adapt to their own products for various reasons, such as transmission speed, multi-channel transmission, scalability, and the like.

Dante has a benefit of operating on an IP network. However, in the past few years, products employing the Dante technology have experienced a number of problems with audio transmission loss in a complicated network.

Dante transmits audio signals and performs a network connection control, a state monitoring, and a signal latency monitoring, but does not perform a level control of transmitted signals or a sound quality control. Yet Dante is well recognized as a good system for a single connection, such as a connection between an audio mixer of a broadcasting studio and a system on a stage.

Korean Laid-open Patent Publication No. 10-2012-0123191 (Nov. 8, 2012) suggests a technology of hierarchically dividing and managing a ring network as a solution to an efficiency issue of equipment management on a single network in an AoIP network in which audio data is transmitted using an IP and other issues such as a network short circuit, a link down, or a network equipment failure that may simultaneously occur to a plurality of nodes on a network.

When a plurality of audio devices distributed in an AoIP-based audio system are connected to AoIP equipment and a problem occurs in the equipment, the connected system is unable to operate. In addition, the AoIP equipment only transmits an audio signal, but does not perform an adjustment to suit an audio environment.

Accordingly, the present inventor has conducted studies concerning a technology in which audio input by a plurality of audio input devices is transmitted to a plurality of audio output devices in a point-to-point, one-to-many, many-to-one, or many-to-many scheme by implementing an on-site audio center system based on the AoIP such that the plurality of audio input devices are connected to the plurality of audio output devices in a one-to-one manner through audio transmitting modules and audio receiving modules and controlling a configuration of an AoIP network through a control personal computer (PC) at a remote site.

Technical Problem

The present invention is directed to providing an on-site audio center system based on an Audio over Internet protocol (AoIP), capable of efficiently transmitting audio by connecting a plurality of audio input devices to a plurality of audio output devices in a one-to-one manner through audio transmitting modules and audio receiving modules, and configuring an AoIP network through a control personal computer (PC).

Technical Solution

One aspect of the present invention provides an on-site audio center system based on an Audio over Internet protocol (AoIP), including: a plurality of first audio transmitting modules each provided at a corresponding one of output ends of a plurality of audio input devices; a plurality of first audio receiving modules each provided at a corresponding one of input ends of a plurality of audio output devices; a hub module configured to connect the plurality of first audio transmitting modules and the plurality of first audio receiving modules to synthesize audio input from the plurality of audio input devices and output the synthesized audio to the plurality of audio output devices; and a control personal computer (PC) configured to perform a user setting with respect to an AoIP network configured by the hub module.

The first audio transmitting module may include: a microphone input terminal for connection of a microphone; a line input terminal for connection of a line level audio input device; an analog-to-digital (AD) converter configured to covert an analog audio signal, which is input through the microphone input terminal or the line input terminal, into digital audio data; a first controller configured to perform a transmission control on the digital audio data; a first communicator configured to transmit the digital audio data on the basis of the AoIP; and a first Ethernet communication terminal configured to output the digital audio data transmitted through the first communicator to the hub module.

The first audio transmitting module may further include a first serial communication terminal for connection of a serial communication audio device.

The first audio receiving module may include: a second Ethernet communication terminal configured to receive digital audio data from the hub module; a second communicator configured to receive the digital audio data, which is based on the AoIP, input through the second Ethernet communication terminal; a second controller configured to perform an output control on the digital audio data received by the second communicator; a digital-to-analog (DA) converter configured to covert digital audio data, which is output and controlled by the second controller, into an analog audio signal; and a line output terminal configured to output the analog audio signal converted by the DA converter to a line level audio output device.

The first audio receiving module may further include a second serial communication terminal configured to receive digital audio data from the hub module in a serial communication method.

The hub module may include: an input side hub configured to form an AoIP network of the plurality of first audio transmitting modules, and receive pieces of digital audio data output from the plurality of first audio transmitting modules included in the AoIP network; a synthesizer configured to synthesize the pieces of digital audio data received by the input side hub; and an output side hub configured to form an AoIP network of the plurality of first audio receiving modules, and transmit the pieces of digital audio data synthesized by the synthesizer to the plurality of first audio receiving modules included in the AoIP network.

The hub module may include: a plurality of second audio receiving modules configured to convert pieces of digital audio data received by the input side hub into analog audio signals so that the analog audio signals are synthesized by the synthesizer and a plurality of second audio transmitting modules configured to convert the analog audio signals synthesized by the synthesizer into pieces of digital audio data and output the pieces of digital audio data to the output side hub.

Advantageous Effects

According to the present invention, an on-site audio center system based on an Audio over Internet protocol (AoIP) is implemented such that a plurality of audio input devices are connected to a plurality of audio output devices in a one-to-one manner through audio transmitting modules and audio receiving modules, and a configuration of an AoIP network is controlled through a control personal computer (PC) so that audio input by the plurality of audio input devices is transmitted to the plurality of audio output devices in a point-to-point, one-to-many, many-to-one, or many-to-many scheme and thus on-site audio control and operation can be efficiently performed.

MODES OF THE INVENTION

Hereinafter, exemplary embodiments of the present invention will be described in detail with reference to the accompanying drawings so that those skilled in the art may easily understand and carry out the present invention.

In the descriptions, details of related known functions or constructions will be omitted to avoid obscuring the subject matter of the present invention.

Although terms used herein are selected from among general terms that are currently and widely used in consideration of functions in the exemplary embodiments, these may be changed according to intentions or customs of those skilled in the art or the advent of new technology. Therefore, the meanings of the terms used herein should be interpreted based on substantial meanings of the terms and content of this entire specification, rather than simply the terms themselves.

Figure 1:
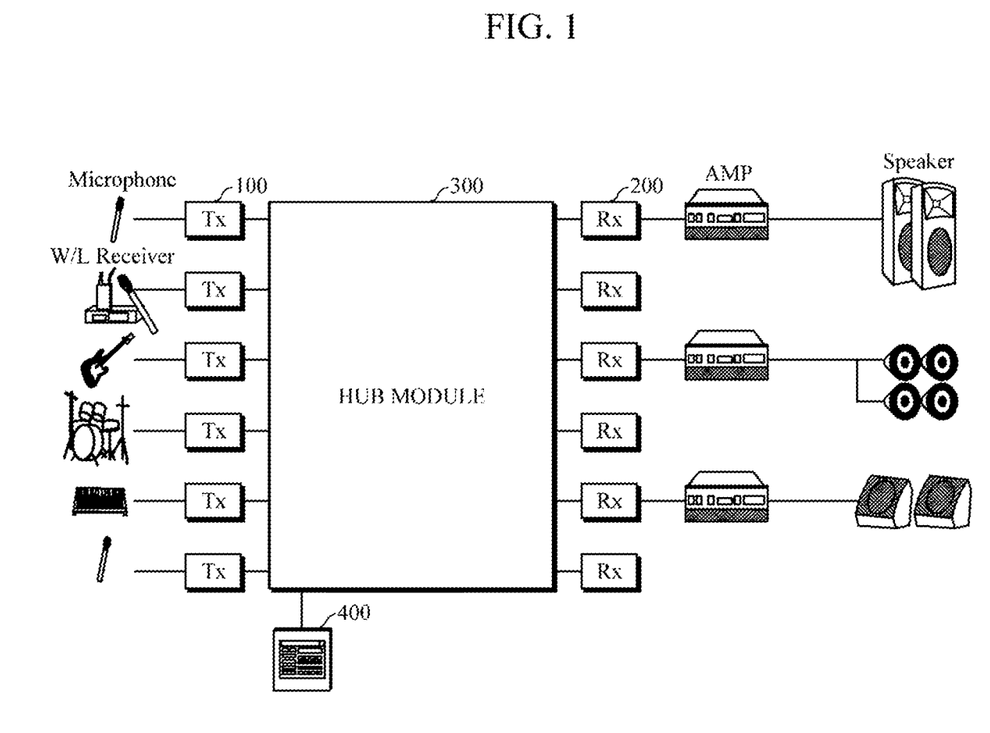
FIG. 1 is a block diagram illustrating a configuration of an on-site audio center system based on an Audio over Internet protocol (AoIP) according to the present invention.

FIG. 1 is a block diagram illustrating a configuration of an on-site audio center system based on an Audio over Internet protocol (AoIP) according to the present invention. Referring to FIG. 1, the on-site audio center system based on the AoIP according to the embodiment of the present invention includes a plurality of first audio transmitting modules 100, a plurality of first audio receiving modules 200, a hub module 300, and a control personal computer (PC) 400.

Each of the first audio transmitting modules 100 are provided at a corresponding one of output ends of a plurality of audio input devices to transmit analog audio signals input from the analog audio input devices or pieces of digital audio data input from the digital audio input devices to the hub module 300.

In this case, the analog audio input device refers to an audio device that inputs an analog audio signal to the first audio transmitting module 100, e.g., a microphone, and the digital audio input device refers to an audio device that inputs digital audio data to the first audio transmitting module 100, e.g., a synthesizer. For each of the audio input devices, a single first audio transmitting module 100 is provided.

For example, the first audio transmitting module 100 may be implemented to convert an analog audio signal input from the audio input device into digital audio data by performing a pulse code modulation on the analog audio signal and broadcast the converted digital audio data to at least one designated first audio receiving module of the first audio receiving modules 200 through the hub module 300 using a user datagram protocol (UDP).

The plurality of first audio receiving modules 200 are provided at input ends of the plurality of audio output devices, and configured to receive digital audio data from the hub module 300 and convert the received digital audio data into an analog audio signal and output the converted analog audio signal to the plurality of audio output devices.

The audio output device may be a power amplifier configured to process an analog audio signal and control audio to be output through at least one speaker. For each of the audio output devices, a single first audio receiving module 200 is provided.

The hub module 300 connects the plurality of first audio transmitting modules 100 and the plurality of first audio receiving modules 200 and configures an AoIP network so that audio input from the plurality of audio input devices is synthesized and output to the plurality of audio output devices.

For example, the hub module 300 may be implemented to configure an AoIP network between the first audio transmitting modules 100, which are connected to the audio input devices in a one-to-one manner, and the first audio receiving modules 200, which are connected to the audio output devices in a one-to-one manner, by referring to previously stored AoIP network configuration information.

In this case, the AoIP network configuration information is user setting information about the first audio receiving modules 200 that are selected to receive pieces of digital audio data transmitted from the first audio transmitting modules 100, and may be set by the control PC 400.

Meanwhile, the configuration of the AoIP network between the first audio transmitting modules 100 and the first audio receiving modules 200 may be formed by mapping IP addresses that are assigned to each of the first audio transmitting modules 100 and each of the first audio receiving modules 200.

The hub module 300 manages an address mapping table according to the configuration of the AoIP network, synthesizes pieces of digital audio data transmitted from the first audio transmitting modules 100, and distributes the synthesized pieces of digital audio data to the first audio receiving modules 200 on the basis of the IP addresses of the first audio receiving modules 200 mapping the IP addresses of the first audio transmitting modules 100 stored in the address mapping table.

Figure 2:
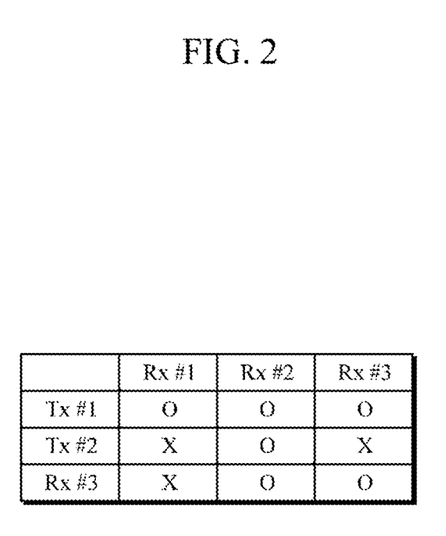
FIG. 2 is a diagram illustrating an example of AoIP configuration information of the on-site audio center system based on the AoIP according to the present invention.

FIG. 2 is a diagram illustrating an example of AoIP configuration information of the on-site audio center system based on the AoIP according to the present invention. Referring to FIG. 2, it can be seen that a first audio transmitting module 'Tx #1' is set to transmit digital audio data to all of first audio receiving modules 'Rx #1', 'Rx #2', and 'Rx #3' in a one-to-many scheme.

Meanwhile, it can be seen that a first audio transmitting module 'Tx #2' is set to transmit digital audio data only to a first audio receiving module 'Rx #2' in a point-to-point (one-to-one) scheme, and a first audio transmitting module 'Tx #3' is set to transmit digital audio data to first audio receiving modules 'Rx #2' and 'Rx #3' in a one-to-many scheme.

Meanwhile, since all of the first audio transmitting modules 'Tx #1', 'Tx #2', and 'Tx #3' are set to transmit digital audio data to the first audio receiving module 'Rx #2', a many-to-one transmission of digital audio data is also achieved.

In this case, the hub module 300 transmits digital audio data transmitted from the first audio transmitting module 'Tx #1' to the first audio receiving module 'Rx #1', synthesizes pieces of digital audio data transmitted from the first audio transmitting modules 'Tx #1', 'Tx #2', and 'Tx #3' and transmits the synthesized pieces of digital audio data to the first audio receiving module 'Rx #2', and synthesizes pieces of digital audio data transmitted from the first audio transmitting modules 'Tx #1' and 'Tx #3' and transmits the synthesized pieces of digital audio data to the first audio receiving module 'Rx #3'.

The control PC 400 performs a user setting on the AoIP network configured by the hub module 300. In this case, the control PC 400 is implemented to, while connected to the hub module 300 via Ethernet, provide a user interface for setting configuration information of an AoIP network, receive an input of the configuration information of the AoIP network from a user through the interface, and store the received configuration information of the AoIP Network.

The configuration information of the AoIP network set by the control PC 400 is referenced by the hub module 300 at a time of configuring the AoIP network between the first audio transmitting modules 100, which are connected to the audio input devices in an one-to-one manner, and the first audio receiving modules 200, which are connected to the audio output devices in an one-to-one manner, such that the hub module 300 configures the AoIP network between the first audio transmitting modules 100 and the first audio receiving modules 200 according to the configuration information of the AoIP network.

According to the present invention, an on-site audio center system based on the AoIP is implemented such that a plurality of audio input devices are connected to first audio transmitting modules in a one-to-one manner and a plurality of audio output devices are connected to first audio receiving modules in a one-to-one manner and the configuration of the AoIP network is controlled through the control PC at a remote site, so that audio input by the plurality of audio input devices is transmitted to the plurality of audio output devices in a point-to-point, one-to-many, many-to-one, or many-to-many scheme, thus on-site audio control management and operation are efficiently performed.

Figure 3:
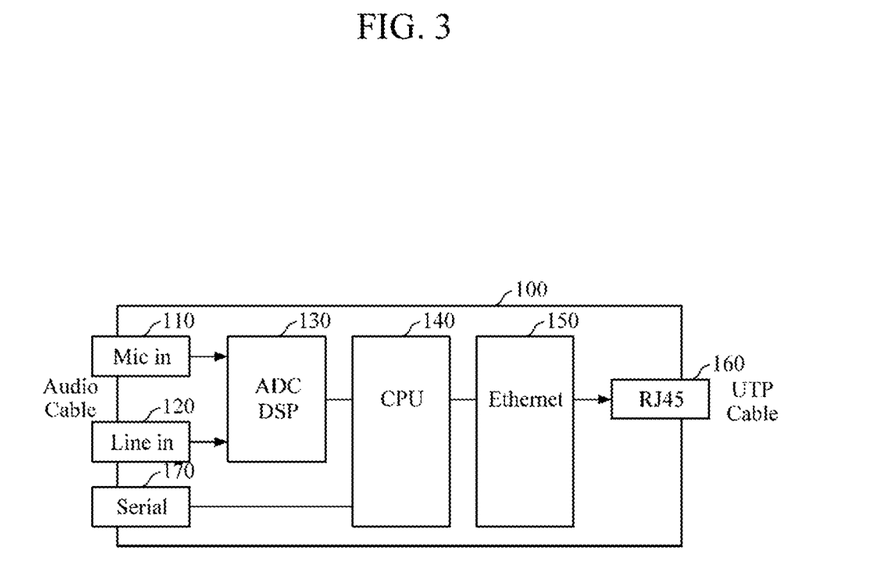
FIG. 3 is a block diagram illustrating a configuration of a first audio transmitting module of the on-site audio center system based on the AoIP according to an embodiment of the present invention.

FIG. 3 is a block diagram illustrating a configuration of a first audio transmitting module of the on-site audio center system based on the AoIP according to an embodiment of the present invention. Referring to FIG. 3, the first audio transmitting module 100 according to the embodiment of the present invention includes a microphone input terminal 110, a line input terminal 120, an analog-to-digital (AD) converter 130, a first controller 140, a first communicator 150, and a first Ethernet communication terminal 160.

The microphone input terminal 110 is a physical interface for connection with a microphone. A microphone is connected through the microphone input terminal 110 so that an analog audio signal is received from the microphone.

The line input terminal 120 is a physical interface for connection with a line level audio input device, and a line level audio input device is connected through the line input terminal 120 such that an audio signal having an audio signal level exceeding an audio signal level input through the microphone is received.

The audio signal level input through the microphone is significantly low, ranging from −70 dBu to −10 dBu, and the audio signal level input through the line level audio input device ranges from −30 dBu and +240 dBu. Accordingly, an audio signal having an audio signal level exceeding that input through the microphone needs to be received through the line input terminal 120.

The AD converter 130 coverts an analog audio signal input through the microphone input terminal 110 or the line input terminal 120 into digital audio data. For example, the AD converter 130 may be implemented to convert an analog audio signal, which is input from the analog audio input device through the microphone input terminal 110 or the line input terminal 120, into digital audio data by performing a pulse code modulation (PCM) on the analog audio signal.

The first controller 140 performs a transmission control on the digital audio data. For example, the first controller 140 may control the digital audio data converted by the AD converter 130 to be transmitted using a UDP.

The first communicator 150 transmits the digital audio data on the basis of the AoIP. For example, the first communicator 150 may control the digital audio data to be broadcasted to at least one designated first audio receiving module of the first audio receiving modules 200.

The first Ethernet communication terminal 160 is a physical interface configured to output the digital audio data transmitted through the first communicator 150 to the hub module 300. Pieces of digital audio data output from the first Ethernet communication terminals 160 of the first audio transmitting modules 100 are synthesized according to the configuration information of the AoIP network configured by the hub module 300 and are transmitted to at least one designated first audio receiving module of the first audio receiving modules 200 through the AoIP-based Ethernet.

Meanwhile, according to another aspect of the present invention, the first audio transmitting module 100 may further include a first serial communication terminal 170. The first serial communication terminal 170 is a physical interface for connection with a serial communication audio device, and allows a serial communication audio device, such as a PC, and a Universal Serial Bus (USB) to be connected therethrough such that digital audio data not needing an AD conversion is received from a serial communication audio device in a serial communication method and is directly input to the first controller 140.

The digital audio data input from the serial communication audio device through the first serial communication terminal 170 is controlled to be transmitted using a UDP by the first controller 140, and then transmitted on the basis of the AoIP through the first communicator 150.

Figure 4:
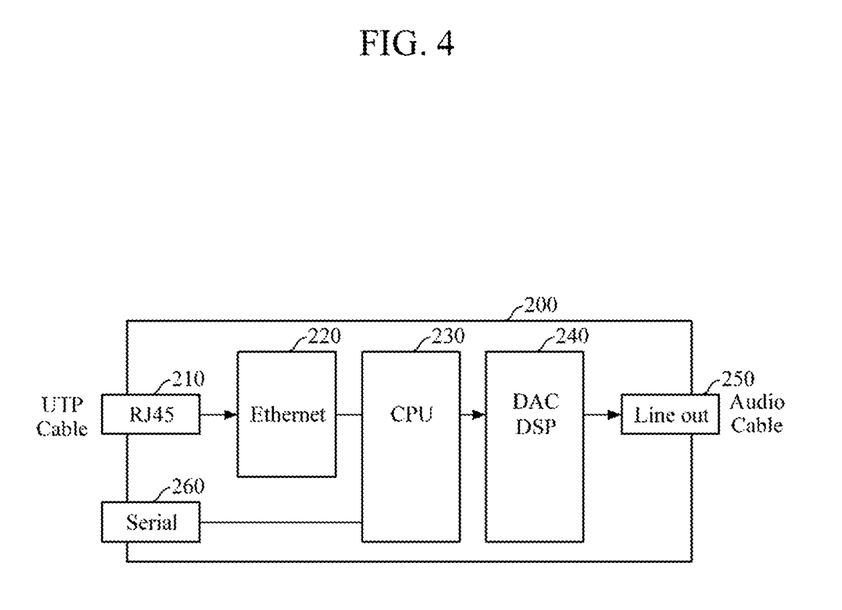
FIG. 4 is a block diagram illustrating a configuration of a first audio receiving module of the on-site audio center system based on the AoIP according to an embodiment of the present invention.

FIG. 4 is a block diagram illustrating a configuration of a first audio receiving module of the on-site audio center system based on the AoIP according to an embodiment of the present invention. Referring to FIG. 4, the first audio receiving module 200 according to the embodiment of the present invention includes a second Ethernet communication terminal 210, a second communicator 220, a second controller 230, a DA converter 240, and a line output terminal 250.

The second Ethernet communication terminal 210 is a physical interface configured to receive digital audio data from the hub module 300.

Pieces of audio data transmitted from the first audio transmitting modules 100 are synthesized according to the configuration information of the AoIP network which is configured by the hub module 300, are transmitted to at least one designated first audio receiving module of the first audio receiving modules 200 through the AoIP-based Ethernet, and the synthesized pieces of digital audio data are input through the second Ethernet communication terminals 210 of the first audio receiving modules 200. The second communicator 220 receives the digital audio data, which is based on the AoIP, input through the second Ethernet communication terminal 210.

The second controller 230 performs an output control on the digital audio data received by the second communicator 220.

The DA converter 240 coverts digital audio data, which is output and controlled by the second controller 230, into an analog audio signal. For example, the DA converter 240 may be implemented to convert digital audio data, which is transmitted through a PCM, into an analog audio signal.

The line output terminal 250 is a physical interface configured to output the analog audio signal that has been converted by the DA converter 240 to a line level audio output device. The analog audio signal is output to the line level output device through the line output terminal 250 and reproduced through a speaker.

Meanwhile, according to another aspect of the present invention, the first audio receiving module 200 may further include a second serial communication terminal 260. The second serial communication terminal 260 is a physical interface configured to receive digital audio data from the hub module 300 in a serial communication method and output the digital audio data to the second controller 230.

The digital audio data input through the second serial communication terminal 260 is converted into an analog audio signal through the DA converter 240 under the output control of the second controller 230 and is output to a line level audio output device through the line output terminal 250 and reproduced through a speaker.

Figure 5:
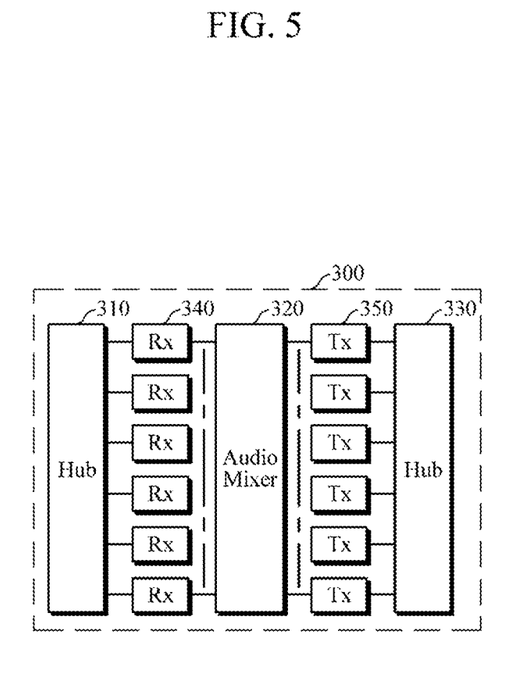
FIG. 5 is a block diagram illustrating a configuration of a hub module of the on-site audio center system based on the AoIP according to the present invention.

FIG. 5 is a block diagram illustrating a configuration of a hub module of the on-site audio center system based on the AoIP according to the present invention. Referring to FIG. 5, the hub module 300 according to the embodiment includes an input side hub 310, a synthesizer 320, and an output side hub 330.

The input side hub 310 serves to configure an AoIP network of the plurality of first audio transmitting modules 100, and receive pieces of digital audio data output from the plurality of first audio transmitting modules 100 included in the AoIP network.

The synthesizer 320 synthesizes the pieces of digital audio data received by the input side hub 310. For example, the synthesizer 320 may be implemented to configure an AoIP network between the first audio transmitting modules 100, which are connected to audio input devices in a one-to-one manner, and the first audio receiving modules 200, which are connected to audio output devices in a one-to-one manner, by referring to previously stored AoIP network configuration information.

In this case, the AoIP network configuration information is user setting information about first audio receiving modules 200 selected to receive pieces of digital audio data transmitted from the first audio transmitting modules 100 and may be set by the control PC 400.

Meanwhile, the configuration of the AoIP network between the first audio transmitting modules 100 and the first audio receiving modules 200 may be formed by mapping IP addresses that are respectively assigned to the first audio transmitting modules 100 and the first audio receiving modules 200.

The synthesizer 320 synthesizes the pieces of digital audio data transmitted from the first audio transmitting modules 100 on the basis of the IP addresses of the first audio receiving modules 200 mapping the IP addresses of the first audio transmitting modules 100 that are stored in an address mapping table according to the configuration of the AoIP network.

The output side hub 330 serves to configure an AoIP network of the plurality of first audio receiving modules 200, and transmit the pieces of digital audio data synthesized by the synthesizer 320 to the plurality of first audio receiving modules 200 included in the AoIP network.

Meanwhile, according to another aspect of the present invention, the hub module 300 includes a plurality of second audio receiving modules 340 and a plurality of second audio transmitting modules 350.

The plurality of second audio receiving modules 340 convert pieces of digital audio data received by the input side hub 310 into analog audio signals such that the analog audio signals are synthesized by the synthesizer 320.

The second audio receiving module 340 has the same configuration as that of the first audio receiving module 200 as shown in FIG. 4. The second audio receiving modules 340 serve as input buffers that temporarily store pieces of digital audio data received through the input side hub 310 while serving as DA converters that convert the pieces of digital audio data into analog audio signals such that the analog audio signals are synthesized by the synthesizer 320.

The second audio transmitting module 350 converts the analog audio signals synthesized by the synthesizer 320 into pieces of digital audio data, and outputs the converted pieces of digital audio data to the output side hub 330.

The second audio transmitting module 350 has the same configuration as that of the first audio transmitting module 100 as shown in FIG. 3. The second audio transmitting modules 350 serve as AD converters that convert analog audio signals synthesized by the synthesizer 320 into pieces of digital audio data while serving as output buffers that temporarily store the pieces of digital audio data to be output to the first audio receiving module 200.

As described above, according to the present invention, an on-site audio center system based on an AoIP is implemented such that a plurality of audio input devices are connected to a plurality of audio output devices in a one-to-one manner through audio transmitting modules and audio receiving modules, and the configuration of the AoIP network is controlled by a control PC at a remote site, so that audio input by the plurality of audio input devices is transmitted to the plurality of audio output devices in a point-to-point, one-to-many, many-to-one, or many-to-many scheme, and on-site audio control management and operation are efficiently performed, and thus the above-suggested technical solutions of the present invention can be achieved.

Although the exemplary embodiments of the present invention have been described in the specification and the accompanying drawings, the exemplary embodiments are intended to not limit the technical spirit of the present invention, and those skilled in the art should appreciate that various substitutions, modifications, and changes are possible without departing from the scope and spirit of the present invention.

INDUSTRIAL APPLICABILITY

The present invention is applicable to an audio control technology and an audio control application technology for industrial use.

The invention claimed is:

1. An on-site audio center system based on an Audio over Internet protocol (AoIP), comprising:
   a plurality of first audio transmitting modules each provided at a corresponding one of output ends of a plurality of audio input devices;
   a plurality of first audio receiving modules each provided at a corresponding one of input ends of a plurality of audio output devices;
   a hub module configured to connect the plurality of first audio transmitting modules and the plurality of first audio receiving modules to synthesize audio input from the plurality of audio input devices and output the synthesized audio to the plurality of audio output devices; and
   a control personal computer (PC) configured to perform a user setting with respect to an AoIP network configured by the hub module,
   wherein pieces of digital audio data output from the first audio transmitting modules are synthesized according to the configuration information of the AoIP network configured by the hub module and are transmitter to at least one designated first audio receiving module of the first audio receiving modules.

2. The on-site audio center system based on the AoIP of claim 1, wherein the first audio transmitting modules comprise:
   a microphone input terminal for connection of a microphone;
   a line input terminal for connection of a line level audio input device;
   an analog-to-digital (AD) converter configured to covert an analog audio signal, which is input through the microphone input terminal or the line input terminal, into digital audio data;
   a first controller configured to perform a transmission control on the digital audio data;
   a first communicator configured to transmit the digital audio data on the basis of the AoIP; and
   a first Ethernet communication terminal configured to output the digital audio data transmitted through the first communicator to the hub module.

3. The on-site audio center system based on the AoIP of claim 2, wherein the first audio transmitting module further comprises a first serial communication terminal for connection of a serial communication audio device.

4. The on-site audio center system based on the AoIP of claim 1, wherein the first audio receiving modules comprise:
   a second Ethernet communication terminal configured to receive digital audio data from the hub module;
   a second communicator configured to receive the digital audio data, which is based on the AoIP, input through the second Ethernet communication terminal;
   a second controller configured to perform an output control on the digital audio data received by the second communicator;
   a digital-to-analog (DA) converter configured to covert digital audio data, which is output and controlled by the second controller, into an analog audio signal; and
   a line output terminal configured to output the analog audio signal converted by the DA converter to a line level audio output device.

5. The on-site audio center system based on the AoIP of claim 4, wherein the first audio receiving module further comprises a second serial communication terminal configured to receive digital audio data from the hub module in a serial communication method.

6. The on-site audio center system based on the AoIP of claim 1, wherein the hub module comprises:
   an input side hub configured to form an AoIP network of the plurality of first audio transmitting modules, and receive pieces of digital audio data output from the plurality of first audio transmitting modules included in the AoIP network;
   a synthesizer configured to synthesize the pieces of digital audio data received by the input side hub; and
   an output side hub configured to form an AoIP network of the plurality of first audio receiving modules, and transmit the pieces of digital audio data synthesized by the synthesizer to the plurality of first audio receiving modules included in the AoIP network.

7. The on-site audio center system based on the AoIP of claim 6, wherein the hub module comprises:
   a plurality of second audio receiving modules configured to convert pieces of digital audio data received by the input side hub into analog audio signals so that the analog audio signals are synthesized by the synthesizer; and
   a plurality of second audio transmitting modules configured to convert the analog audio signals synthesized by the synthesizer into pieces of digital audio data and output the pieces of digital audio data to the output side hub.

* * * * *